(12) United States Patent
Jiang et al.

(10) Patent No.: US 10,990,230 B2
(45) Date of Patent: *Apr. 27, 2021

(54) CIRCUIT, TOUCH CHIP, AND ELECTRONIC DEVICE FOR CAPACITANCE DETECTION

(71) Applicant: SHENZHEN GOODIX TECHNOLOGY CO., LTD., Shenzhen (CN)

(72) Inventors: Hong Jiang, Shenzhen (CN); Zhi Tang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,889

(22) Filed: Oct. 27, 2019

(65) Prior Publication Data
US 2020/0081567 A1 Mar. 12, 2020

Related U.S. Application Data

(63) Continuation of application No. PCT/CN2018/104618, filed on Sep. 7, 2018.

(51) Int. Cl.
*G06F 3/041* (2006.01)
*G06F 3/044* (2006.01)
*G01R 27/26* (2006.01)

(52) U.S. Cl.
CPC ......... *G06F 3/044* (2013.01); *G01R 27/2605* (2013.01); *G06F 3/0416* (2013.01); *G06F 3/0418* (2013.01)

(58) Field of Classification Search
CPC ............... G01R 27/2605; G06F 3/0416; G06F 3/04166; G06F 3/0418; G06F 3/044; G06F 3/0446
See application file for complete search history.

(56) References Cited

U.S. PATENT DOCUMENTS

2008/0048680 A1* 2/2008 Hargreaves ........ G01R 27/2605
324/686
2009/0243631 A1* 10/2009 Kuang ............... G01R 27/2605
324/658
(Continued)

FOREIGN PATENT DOCUMENTS

CN 102200869 A 9/2011
CN 104049822 A 9/2014
(Continued)

*Primary Examiner* — Hong Zhou
(74) *Attorney, Agent, or Firm* — Brion Raffoul

(57) ABSTRACT

Embodiments of the present disclosure provide a circuit, touch chip, and electronic device for capacitance detection, the circuit for capacitance detection comprising: a control module, a charge transfer module, a processing module, a driving module, and an offsetting module, the control module being configured to charge a detection capacitor by controlling the driving module, the offsetting module being configured to charge an offset capacitor, and control the offset capacitor to perform charge offsetting on the detection capacitor; the charge transfer module being configured to convert charge of the detection capacitor after the charge offsetting to generate an output voltage; and the processing module being configured to determine, based on the output voltage, a capacitance variation of the detection capacitor before and after the detection capacitor is affected by an external electric field.

18 Claims, 6 Drawing Sheets

(56) References Cited

U.S. PATENT DOCUMENTS

| | | | | |
|---|---|---|---|---|
| 2010/0253368 A1* | 10/2010 | Cheng | ................ | G01R 27/2605 |
| | | | | 324/658 |
| 2011/0261006 A1* | 10/2011 | Joharapurkar | .... | G06F 3/041662 |
| | | | | 345/174 |
| 2013/0307811 A1* | 11/2013 | Hanssen | .............. | H03K 17/962 |
| | | | | 345/174 |
| 2015/0338952 A1* | 11/2015 | Shahparnia | ............. | G06F 3/044 |
| | | | | 345/174 |
| 2016/0124544 A1* | 5/2016 | Kang | ...................... | G06F 1/163 |
| | | | | 345/174 |
| 2016/0349906 A1* | 12/2016 | Lee | .......................... | G01L 1/14 |
| 2016/0364079 A1 | 12/2016 | Qiu et al. | | |
| 2018/0121020 A1* | 5/2018 | Lee | ....................... | G06F 3/0446 |
| 2018/0150157 A1* | 5/2018 | Fan | ........................ | G06F 3/044 |
| 2018/0238944 A1* | 8/2018 | Yoo | .................... | G01R 27/2605 |
| 2019/0302928 A1 | 10/2019 | Yuan et al. | | |

FOREIGN PATENT DOCUMENTS

| | | |
|---|---|---|
| CN | 106598370 A | 4/2017 |
| CN | 106648268 A | 5/2017 |
| CN | 107690584 A | 2/2018 |
| CN | 107980115 A | 5/2018 |
| CN | 108064344 A | 5/2018 |
| CN | 108124474 A | 6/2018 |
| CN | 108475155 A | 8/2018 |
| JP | 2018101281 A | 6/2018 |

\* cited by examiner

CIRCUIT, TOUCH CHIP, AND ELECTRONIC DEVICE FOR CAPACITANCE DETECTION

CROSS REFERENCE TO RELATED APPLICATIONS

The present application is a continuation of international application No. PCT/CN2018/104618 filed on Sep. 7, 2018, which is hereby incorporated by reference in its entirety.

TECHNICAL FIELD

Embodiments of the present disclosure relate to the field of touch control technology, and in particular to, a circuit, touch chip, and electronic device for capacitance detection.

BACKGROUND

The principle of self-capacitance detection is that a capacitor will be formed between a detection electrode and system ground, which is known as the self-capacitance detection. When no external electric field is caused by, e.g., a finger, the capacitor formed between the detection electrode and the system ground has base capacitance or initial capacitance. When the finger approaches or touches the detection electrode, the capacitance between the detection electrode and the system ground will be increased, and a user-related touch control operation may be determined by detecting a variation of the capacitance.

In the field of capacitance touch control, the flexible screen is an important development direction. When capacitance touch detection is implemented using the above-mentioned self-capacitance principle, since the flexible screen is often thinner than a conventional capacitance touch screen, the detection electrode is nearer to the system ground. Thus, the base capacitance of the capacitor is obviously higher than the base capacitance of the capacitor of the conventional capacitance touch screen. In addition, since a metal-mesh is used as the detection electrode, the sensing area is relatively small, such that when the finger touches the capacitor, the capacitance variation is very small. A small capacitance variation means to require a high circuit gain, such that the detection circuit can detect an electrical signal generated by the capacitance variation during touching, but since the base capacitance is much higher than the capacitance variation, a high circuit gain, if employed, further tends to cause detection circuit saturation.

In addition, the small capacitance variation also generates a very small electrical signal, which is easily submerged in circuit noise, thus failing to be detected. Thus, it can be seen that, the related art has low sensitivity of the self-capacitance detection, finally resulting in the defect of low accuracy of the self-capacitance detection.

SUMMARY

In view of this, one of the technical problems solved by embodiments of the present disclosure is to provide a circuit, touch chip, and electronic device for capacitance detection, to overcome the above defect in the related art.

An embodiment of the present disclosure provides a circuit for capacitance detection, including: a control module, a charge transfer module, a processing module, a driving module, and an offsetting module, the control module being configured to charge a detection capacitor by controlling the driving module, the offsetting module being configured to charge an offset capacitor, and control the offset capacitor to perform charge offsetting on the detection capacitor; the charge transfer module being configured to convert charge of the detection capacitor after the charge offsetting to generate an output voltage; and the processing module being configured to determine, based on the output voltage, a capacitance variation of the detection capacitor before and after the detection capacitor is affected by an external electric field.

An embodiment of the present disclosure provides a touch chip, including: the circuit for capacitance detection according to any one embodiment of the present disclosure.

An embodiment of the present disclosure provides an electronic device, including the touch chip according to any one embodiment of the present disclosure.

In the technical solutions provided by embodiments of the present disclosure, a circuit for capacitance detection includes: a control module, a charge transfer module, a processing module, a driving module, and an offsetting module, the control module being configured to charge a detection capacitor by controlling the driving module, the offsetting module being configured to charge an offset capacitor, and control the offset capacitor to perform charge offsetting on the detection capacitor; the charge transfer module being configured to convert charge of the detection capacitor after the charge offsetting to generate an output voltage; and the processing module being configured to determine, based on the output voltage, a capacitance variation of the detection capacitor before and after the detection capacitor is affected by an external electric field. When the circuit is applied to self-capacitance detection, a detected base capacitance of the detection capacitor may be eliminated or reduced by charge offsetting, thereby improving the capacitance variation rate and enhancing the sensitivity of the self-capacitance detection in a circumstance where the capacitance variation remains unchanged, and finally improving the accuracy of the self-capacitance detection.

BRIEF DESCRIPTION OF THE DRAWINGS

Some specific embodiments of embodiments of the present disclosure will be described in detail below with reference to the accompanying drawings, by an exemplary approach, instead of a non-limiting approach. Identical reference numerals in the accompanying drawings represent identical or similar components or parts. As will be appreciated by those skilled in the art, these accompanying drawings may not be drawn to scale. In the accompanying drawings.

DETAILED DESCRIPTION

Any technical solution of embodiments of the present disclosure may not necessarily be implemented to achieve all of the above advantages.

In the technical solutions provided by embodiments of the present disclosure, a circuit for capacitance detection includes: a control module, a charge transfer module, a processing module, a driving module, and an offsetting module, the control module being configured to charge a detection capacitor by controlling the driving module, the offsetting module being configured to charge an offset capacitor, and control the offset capacitor to perform charge offsetting on the detection capacitor; the charge transfer module being configured to convert charge of the detection capacitor after the charge offsetting to generate an output voltage; and the processing module being configured to determine, based on the output voltage, a capacitance variation of the detection capacitor before and after the detection capacitor is affected by an external electric field. When the circuit is applied to self-capacitance detection, base capacitance of a detected detection capacitor may be eliminated or reduced by charge offsetting, thereby improving the capacitance variation rate and enhancing the sensitivity of the self-capacitance detection in a circumstance where the capacitance variation remains unchanged, and finally improving the accuracy of the self-capacitance detection.

Specific implementations of the embodiments of the present disclosure will be further illustrated below in conjunction with the accompanying drawings of the embodiments of the present disclosure.

The following FIGS. 2 to 7 are described, e.g., to achieve self-capacitance detection of a detection capacitor. Therefore, in the following embodiments, accordingly, each of the number of driving modules and the number of offsetting modules is one. In practice, by extension, from the perspective of technological concepts, if there are a plurality of detection capacitors, then a plurality of driving modules and offsetting modules may be provided accordingly, or for one detection capacitance, one driving module and one offsetting module may be provided.

Figure 1:
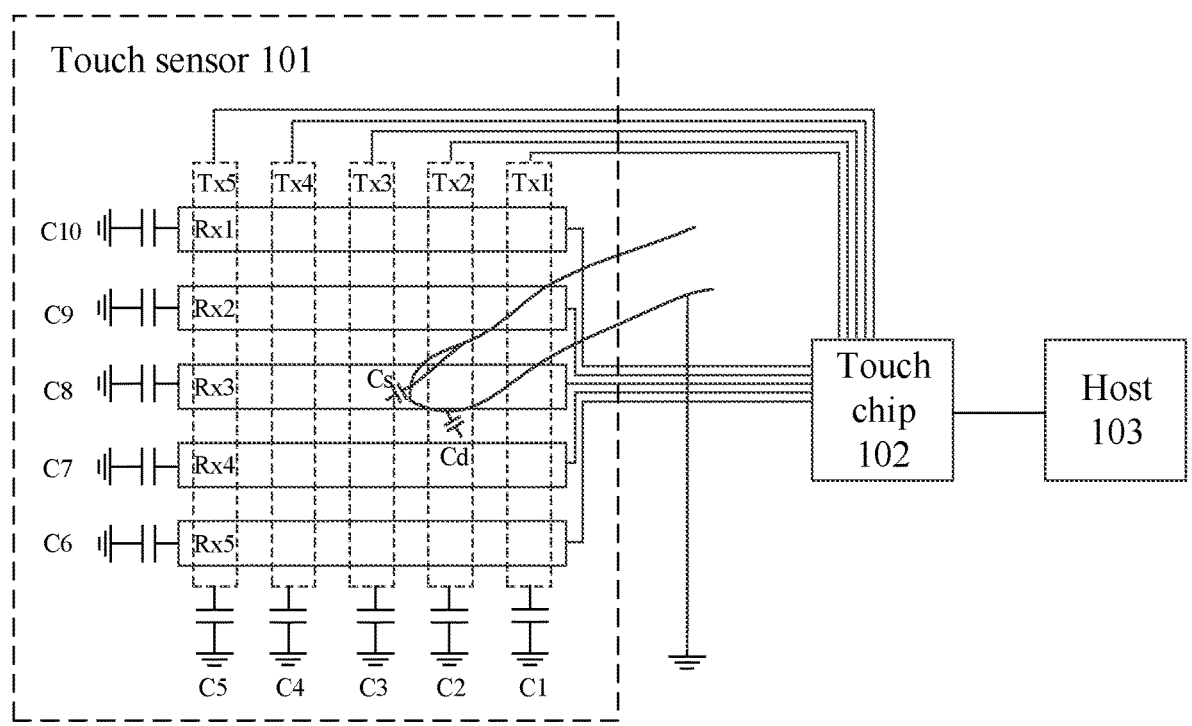
FIG. 1 is a schematic structural diagram of a system for capacitance touch control according to Embodiment I of the present disclosure.

FIG. 1 is a schematic structural diagram of a system for capacitance touch control according to Embodiment I of the present disclosure. As shown in FIG. 1, the system for capacitance touch control includes a touch sensor 101, a touch chip 102, and a host 103. The touch sensor 101 is a bilayer structure, including a driving channel Tx and a sensing channel Rx, base capacitances of which to system ground are denoted as C1-C5 and C6-C10. During self-capacitance detection, the touch chip 102 will scan the capacitance of each channel (driving channel, sensing channel) to the system ground, and compute the capacitance variation of each channel to the system ground. When a finger approaches or touches a touch screen, capacitance of the channel where the finger approaches or touches to the system ground will become higher. As shown in FIG. 1, if the capacitance between the finger and the driving channel Tx is Cd, and the capacitance between the finger and the sensing channel Rx is Cs. For example, when the finger approaches a driving channel Tx2 and a sensing channel Rx3, since a human body, as a conductor, is connected to the system ground, the capacitance of the driving channel Tx2 to the system ground will become C2+Cd, and the capacitance of a sensing channel Rx3 to the system ground will become C8+Cs. The touch chip 102 detects that both the capacitance of the driving channel Tx2 and the capacitance of the sensing channel Rx3 to the system ground will become higher, while the capacitance of other channels to the system ground remains unchanged, or approximately remains unchanged, or is small. Therefore, it may be computed that the touched position is an intersection of the driving channel Tx2 and the sensing channel Rx3. Coordinates of the position are sent to the host 103 to implement touch control operations of various functions.

In the present embodiment, a circuit for capacitance detection is specifically provided on the touch chip 102 in FIG. 1. Therefore, it may be understood that the above touch chip 102 includes the circuit for capacitance detection described in the following embodiments.

Figure 2:
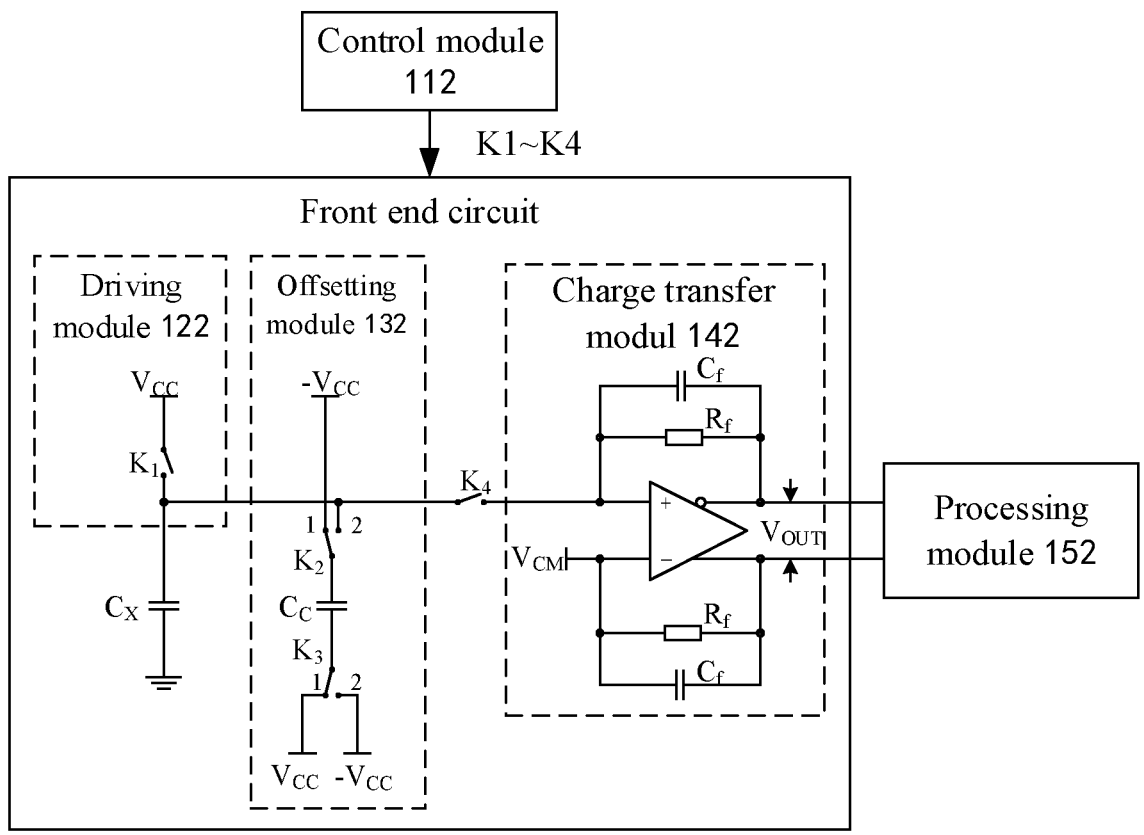
FIG. 2 is a schematic structural diagram of a circuit for capacitance detection according to Embodiment II of the present disclosure.

FIG. 2 is a schematic structural diagram of a circuit for capacitance detection according to Embodiment II of present disclosure. As shown in FIG. 2, the circuit for capacitance detection includes: a control module 112, a driving module 122, an offsetting module 132, a charge transfer module 142, and a processing module 152. The driving module 122, the offsetting module 132, and the charge transfer module 142 are specifically provided in a front-end circuit. The control module 112 is configured to charge the detection capacitor by controlling the driving module 122, and charge the offset capacitor by controlling the offsetting module 132, such that the offset capacitor performs charge offsetting on the detection capacitor; the charge transfer module 142 is configured to convert charge of the detection capacitor after the charge offsetting to generate an output voltage; and the processing module 152 is configured to determine, based on the output voltage (Vout), a capacitance variation of the detection capacitor before and after the detection capacitor is affected by an external electric field.

As shown in FIG. 2, the driving module 122 includes a first switching unit $K_1$ (e.g., a single switch implementation), and the control module 112 is further configured to control the first switching unit $K_1$ to be in a closed state, such that the driving module 122 charges the detection capacitor Cx. Further, when the first switching unit $K_1$ is in the closed state, a first terminal of the detection capacitor Cx is electrically connected to a first voltage (VCC), a second terminal of the detection capacitor is electrically connected to a second voltage (GND), and the first voltage is higher than the second voltage. In the present embodiment, VCC is a positive supply voltage.

As shown in FIG. 2, the offsetting module 132 includes a second switching unit $K_2$ (e.g., a single switch implementation), and a third switching unit $K_3$ (e.g., a single switch implementation). The second switching unit $K_2$ and the third switching unit $K_3$ may be in different closed states, to achieve charging the offset capacitor, and charge offsetting of the offset capacitor on the detection capacitor.

Specifically, when the offsetting module 132 includes the second switching unit $K_2$ and the third switching unit $K_3$, the control module 112 controls the second switching unit $K_2$ and the third switching unit $K_3$ to be in a first closed state, and form a charging branch circuit, such that the offsetting module 132 charges the offset capacitor. Specifically, when the second switching unit $K_2$ and the third switching unit $K_3$ are in the first closed state, a first terminal of the offset capacitor Cc is electrically connected to a third voltage (−VCC) via the second switching unit $K_2$, a second terminal of the offset capacitor Cc is electrically connected to a fourth voltage (VCC) via the third switching unit $K_3$, and the fourth voltage is higher than the third voltage.

Further, the control module 112 controls the second switching unit $K_2$ and the third switching unit $K_3$ to be in a second closed state, and form an offsetting branch circuit. Charged detection capacitor and charged offset capacitor store different amounts of charge, such that the offset capacitor may perform charge offsetting on the detection capacitor when the charging branch circuit is switched to the offsetting branch circuit. Specifically, when the control module 112 controls the second switching unit $K_2$ and the third switching unit $K_3$ to be in the second closed state, the first terminal of the offset capacitor Cc is electrically connected to the first terminal of the detection capacitor Cx, the second terminal of the offset capacitor Cc is electrically connected to a fifth voltage (−VCC), and the fifth voltage is lower than the second voltage (GND) electrically connected to the second terminal of the detection capacitor Cx. In the present embodiment, −VCC is a negative supply voltage.

As shown in FIG. 2, a fourth switching unit $K_4$ (e.g., a single switch implementation) is provided between the charge transfer module 142 and the offsetting module 132. Accordingly, the control module 112 further controls the fourth switching unit $K_4$ to be in the closed state, such that the charge transfer module 142 is electrically connected to the detection capacitor Cx, to convert the charge of the detection capacitor Cx after the charge offsetting to generate the output voltage (Vout).

In the present embodiment, the charge transfer module 142 is specifically a fully differential amplifying circuit. Further, a normal phase terminal of the fully differential amplifying circuit is electrically connected to the fourth switch $K_4$, and a negative phase terminal of the fully differential amplifying circuit is connected to a common mode voltage (Vcm). A feedback resistor Rf and a feedback capacitor Cf are provided between the normal phase terminal and the output terminal, and between the negative phase terminal and the output terminal, of the fully differential amplifying circuit.

In the present embodiment, the first switching unit $K_1$ and the fourth switching unit $K_4$ are single-pole single-throw switches. The second switching unit $K_2$ and the third switching unit are single-pole double-throw switches. Thus, in order to switch between the charging branch circuit and the offsetting branch circuit, a contact S1 and a contact S2 are provided. The contact S1 is located on the charging branch circuit, and the contact S2 is located on the offsetting branch circuit. The description of FIG. 3 below is referred to for details.

Figure 3:
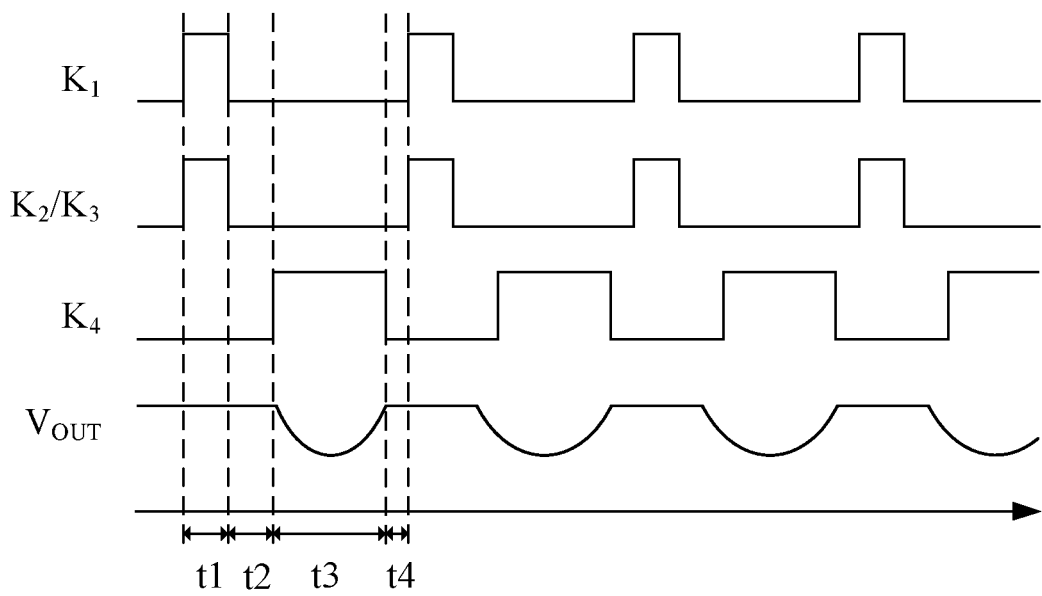
FIG. 3 is a sequence chart when the circuit for capacitance detection in FIG. 2 is working according to Embodiment III of the present disclosure.

FIG. 3 is a sequence chart when the circuit for capacitance detection in FIG. 2 is working according to Embodiment III of the present disclosure. As shown in FIG. 3, a detection period including time intervals t1 to t4 actually includes a finger touch control duration, which may cover a plurality of detection periods. Main technical processing of each time interval is briefly described as follows:

time interval t1: charging the detection capacitor Cx and the offset capacitor Cc;

time interval t2: performing charge offsetting between the detection capacitor Cx and the offset capacitor Cc;

time interval t3: transferring charge to convert the charge into a voltage signal; and time interval t4: resetting the fully differential amplifying circuit.

In the time interval t1, the first switching unit $K_1$ is switched on (i.e., in the closed state), the second switching unit $K_2$ and the third switching unit $K_3$ are connected to the contact S1 (i.e., in the first closed state), the fourth switching unit $K_4$ is switched off, and the detection capacitor Cx and the offset capacitor Cc are charged simultaneously. When the time interval t1 is completed, a voltage of the detection capacitor Cx is Vcc, and a voltage of the offset capacitor Cc is −2Vcc. In addition, since the fourth switching unit $K_4$ is switched off, the output voltage (Vout) of the charge transfer module is 0. In this case, the amount of charge stored in the detection capacitor Cx is Q1=Vcc*Cx, and the amount of charge stored in the offset capacitor Cc is Q2=−2Vcc*Cc.

In the time interval t2, the first switching unit $K_1$ and the fourth switching unit $K_4$ are switched off, the second switching unit $K_2$ and the third switching unit $K_3$ are connected to the contact S2 (i.e., in the second closed state), and the charge stored in the detection capacitor Cx and the charge stored in the offset capacitor Cc are neutralized and offset. After reaching a steady state, in accordance with the charge conservation law, there is $V_{CC}C_X$, $-2V_{CC}C_C=V_XC_X+(V_X+V_{CC})C_C$, and a voltage Vx of the detection capacitor Cx may be obtained:

$$V_X = \frac{V_{CC}C_X - 3V_{CC}C_C}{C_X + C_C}.$$

In the time interval t3, the first switching unit $K_1$ is switched off, the second switching unit $K_2$ and the third switching unit $K_3$ are connected to the contact S2 (i.e., in the second closed state), and the fourth switching unit $K_4$ is switched on (i.e., in the closed state). Based on the magnitude of the voltage Vx of the detection capacitor Cx, there are the situations below:

If Vx>Vcm, the detection capacitor Cx and the offset capacitor Cc transfer charge to the charge transfer module simultaneously, until the voltage Vx of the detection capacitor Cx reaches Vcm. In this process, the output voltage (Vout) of the charge transfer module is a negative voltage.

If Vx=Vcm, then there is not a process of charge transfer from the detection capacitor Cx and the offset capacitor Cc to the charge transfer module, and the output voltage (Vout) of the charge transfer module is 0. In this case, the circuit reaches a complete offset state. Circuit parameters (details as below) are reasonably defined, such that in case of no touching, the circuit can reach a complete offset state, and can completely offset the base capacitance of the detection capacitor Cx, while in case of touching, the capacitance of the detection capacitor Cx becomes higher on the basis of the base capacitance thereof, and the voltage of the output voltage (Vout) is completely caused by touching. Accordingly, the detection sensitivity in this state is highest.

If Vx<Vcm, the charge transfer module will charge the detection capacitor Cx and the offset capacitor Cc via a feedback network (including $R_f$ and $C_f$), until both the voltage of the detection capacitor Cx and the voltage of the offset capacitor Cc reach Vcm. In this process, the output voltage (Vout) of the charge transfer module is a positive voltage.

In the time interval t4, the first switching unit $K_1$ is switched off, the second switching unit $K_2$ and the third switching unit $K_3$ are in the second closed state, the fourth switching unit $K_4$ is switched off, the detection capacitor Cx and the offset capacitor Cc are reset, and the output voltage (Vout) becomes 0.

As can be seen from the above, when the time interval t2 is completed:

$$V_{CC}C_X - 2V_{CC}C_C = V_XC_X + (V_X + V_{CC})C_C$$

As can be seen from the above, when the time interval t3 is completed, the voltage of the detection capacitor Cx and the offset capacitor Cc is constant (Vcm), and the amount of transferred charge is:

$$\Delta Q = V_X C_X + (V_X + V_{CC})C_C - [V_{CM}C_X + (V_{CM} + V_{CC})C_C]$$
$$= V_{CC}C_X - 2V_{CC}C_C - [V_{CM}C_X + (V_{CM} + V_{CC})C_C]$$
$$= (V_{CC} - V_{CM})C_X - (3V_{CC} + V_{CM})C_C$$

In the above equation, from the perspective of the representative meaning, when the finger touches the detection capacitor Cx, the capacitance of the detection capacitor may be changed to $(C_{X0}+\Delta C)$, $\Delta C$ represents the capacitance variation of the detection capacitor, and $C_{X0}$ represents the base capacitance of the detection capacitor. For self-capacitance detection, $\Delta C=0$ when no finger touches the detection capacitor, and $\Delta C>0$ when the finger touches the detection capacitor.

Based on the time sequence of t1-t4, the amount of transferred charge may be obtained as $\Delta Q=(V_{CC}-V_{CM})(C_{X0}+\Delta C)-(3V_{CC}+V_{CM})C_C$. In the complete offset state, the amount of transferred charge is $\Delta Q=(V_{CC}-V_{CM})\cdot\Delta C$, and an average value of the output voltage may be obtained as $V_{OUT}=2\Delta Q\cdot f\cdot R_f$, and denotes a detection frequency, the value of which is a reciprocal of a detection period composed of the time intervals t1-t4.

In the complete offset state, Vx=Vcm, and there is the following relationship:

$$(V_{CC}-V_{CM})C_{X0}=(3V_{CC}+V_{CM})C_C$$

The capacitance of the offset capacitor Cc may be obtained as $$C_C = \frac{V_{CC} - V_{CM}}{3V_{CC} + V_{CM}} C_{X0}.$$

Cc, $C_{x0}$, Vcc, and Vcm are defined in accordance with the equation, such that the circuit can reach a complete offset state. In particular, when $V_{CC}=2V_{CM}$, there is $$C_C = \frac{C_{X0}}{7}.$$

Thus, in case of complete offset, the capacitance of the offset capacitor Cc is 1/7 of the base capacitance of the detection capacitor Cx.

As can be seen from the above inference process, the offset capacitor Cc is preferably selected or designed such that the capacitance of the offset capacitor is 1/7 of the base capacitance of the detection capacitor Cx. In addition, in order to prevent the capacitance variation of the offset capacitor from affecting the capacitance variation detection of the detection capacitor when the touch screen is touched, the offset capacitance Cc is preferably a capacitor that does not have capacitance variation caused by touching.

Figure 4:
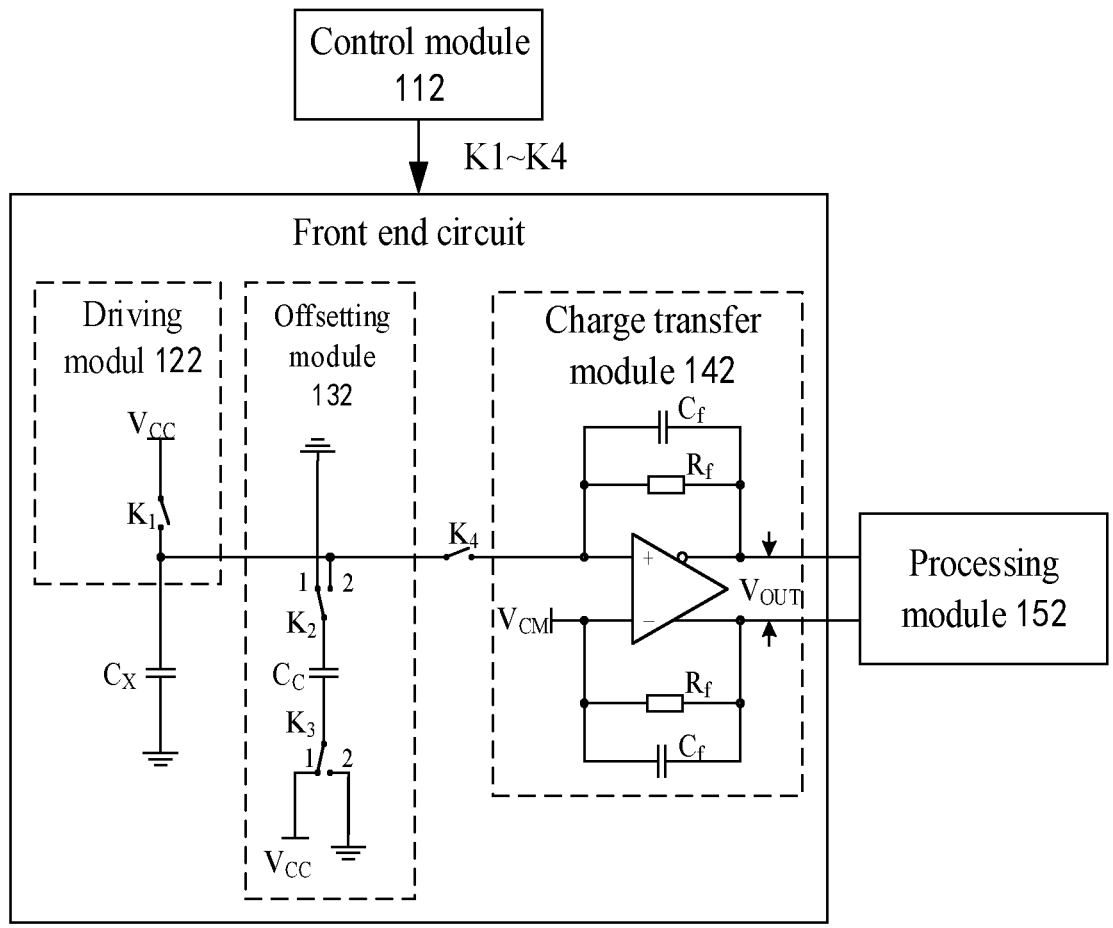
FIG. 4 is a schematic structural diagram of a circuit for capacitance detection according to Embodiment IV of the present disclosure.

FIG. 4 is a schematic structural diagram of a circuit for capacitance detection according to Embodiment IV of the present disclosure. As shown in FIG. 4, like the above embodiments, the circuit includes: the control module 112, the driving module 122, the offsetting module 132, the charge transfer module 142, and the processing module 152. Different from the above Embodiment III, when the second switching unit $K_2$ and the third switching unit $K_3$ are in the second closed state, the first terminal of the offset capacitor Cc is electrically connected to the first terminal of the detection capacitor Cx, the second terminal of the offset capacitor Cc is electrically connected to a sixth voltage (GND), and the sixth voltage is equal to the second voltage (GND) electrically connected to the second terminal of the detection capacitor Cx. That is, the negative voltage –Vcc in the above charging branch circuit and offsetting branch circuit in FIG. 2 is replaced with the system ground. Settings of the first switching unit $K_1$ to the fourth switching unit $K_4$ are identical to the embodiment shown in FIG. 2, so is the switching action control.

Figure 5:
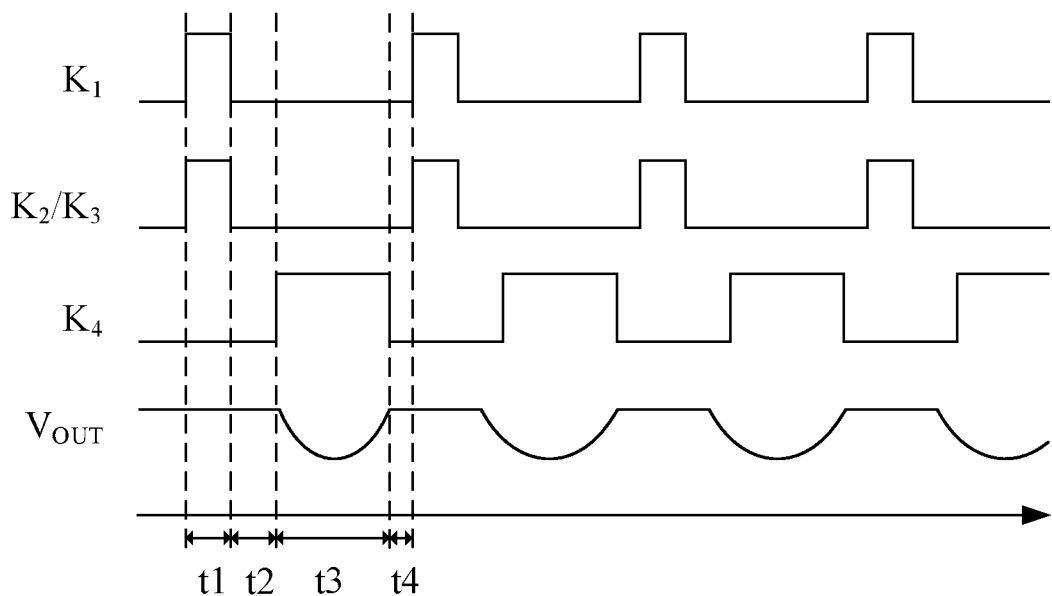
FIG. 5 is a sequence chart when the circuit for capacitance detection in FIG. 4 is working according to Embodiment IV of the present disclosure.

FIG. 5 is a sequence chart when the circuit for capacitance detection in FIG. 4 is working according to Embodiment IV of the present disclosure. As shown in FIG. 5, one detection period still includes the time intervals t1-t4. The detailed timing sequence is as follows:

In the time interval t1, the first switching unit $K_1$ is switched on, the second switching unit $K_2$ and the third switching unit $K_3$ are connected to the contact S1, the fourth switching unit $K_4$ is switched off, and the detection capacitor Cx and the offset capacitor Cc are charged simultaneously. When the time interval t1 is completed, a voltage of the detection capacitor Cx is Vcc, a voltage of the offset capacitor Cc is –Vcc, and an output voltage ($V_{OUT}$) of the charge transfer module is 0. In this case, the amount of charge stored in the detection capacitor Cx is Q1=Vcc*Cx, and the amount of charge stored in the offset capacitor Cc is Q2=–Vcc*Cc.

In the time interval t2, the first switching unit $K_1$ and the fourth switching unit $K_4$ are switched off, the second switching unit $K_2$ and the third switching unit $K_3$ are connected to the contact S2, and the charge stored in the detection capacitor Cx and the charge stored in the offset capacitor Cc are neutralized and offset. After reaching a steady state, in accordance with the charge conservation law, there is $V_{CC}C_X-V_{CC}C_C=V_X(C_X+C_C)$, and a voltage of the detection capacitor Cx may be obtained as $$V_X = \frac{V_{CC}(C_X - C_C)}{C_X + C_C}.$$

In the time interval t3, the first switching unit $K_1$ is switched off, the second switching unit $K_2$ and the third switching unit $K_3$ are connected to the contact S2, and the fourth switching unit $K_4$ is switched on. Based on the magnitude of the voltage Vx, there are the situations below:

If Vx>Vcm, the detection capacitor Cx and the offset capacitor Cc transfer charge to the charge transfer module simultaneously, until the voltage of the detection capacitor Cx reaches Vcm. In this process, the output voltage (Vout) of the charge transfer module is a negative voltage.

If Vx=Vcm, then there is not a process of charge transfer from the detection capacitor Cx and the offset capacitor Cc to the charge transfer module, and the output voltage (Vout) of the charge transfer module is 0. In this case, the circuit reaches a perfect offset state. Circuit parameters (details as below) are reasonably defined, such that in case of no touching, the circuit can reach a complete offset state, and can completely offset the base capacitance of the detection capacitor Cx, while in case of touching, the capacitance of the detection capacitor Cx becomes higher, and the output voltage (Vout) is completely caused by touching. Accordingly, the detection sensitivity in this state is highest.

If Vx<Vcm, the charge transfer module will charge the detection capacitor Cx and the offset capacitor Cc via the feedback network including Rf and Cf, until both the Cx and the Cc reach Vcm. In this process, the output voltage (Vout) of the charge transfer module is a positive voltage.

During t4, the fourth switching unit $K_4$ is switched off, the charge transfer module is reset, and the output voltage (Vout) becomes 0.

Based on the time sequence of t1-t4, the amount of transferred charge may be obtained as $\Delta Q=(V_{CC}-V_{CM})(C_{X0}+\Delta C)-(V_{CC}+V_{CM})C_C$. In the complete offset state, the amount of transferred charge is $\Delta Q=(V_{CC}-V_C)\cdot \Delta C$. In the complete offset state, Vx=Vcm, and there is the following relationship:

$$(V_{CC}-V_{CM})C_{X0}=(V_{CC}+V_{CM})C_C$$

The capacitance of the offset capacitor Cc may be obtained as $$C_C = \frac{V_{CC}-V_{CM}}{V_{CC}+V_{CM}}C_{X0},$$

and in particular, when $V_{CC}=2V_{CM}$, there is $$C_C = \frac{C_{X0}}{3}.$$

Thus, in case of complete offset, the capacitance of the offset capacitor Cc is ⅓ of the base capacitance of the detection capacitor Cx. Thus it can be seen that, the capacitance of the offset capacitance Cc in the present embodiment is 7/3 times as much as that in the embodiment of FIG. 2.

Thus, theoretically, the capacitance of the offset capacitor can be designed in accordance with the above situation of complete offset.

Figure 6:
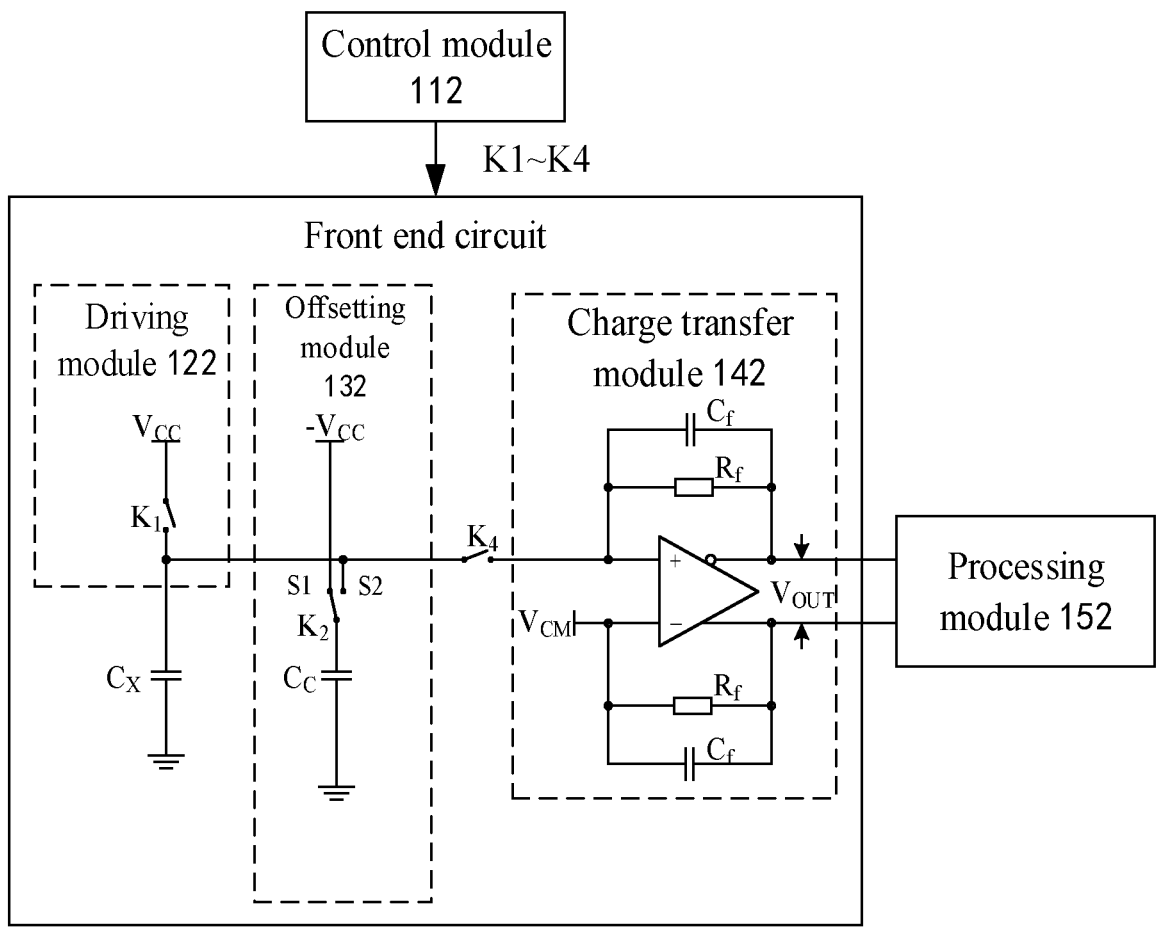
FIG. 6 is a schematic structural diagram of a circuit for capacitance detection according to Embodiment VI of the present disclosure.

FIG. 6 is a schematic structural diagram of a circuit for capacitance detection according to Embodiment VI of the present disclosure. As shown in FIG. 6, like the above embodiment, the circuit for capacitance detection includes: the control module 112, the driving module 122, the offsetting module 132, the charge transfer module 142, and the processing module 152.

Different from the above embodiments, the offsetting module 132 includes the second switching unit (excluding the third switching unit $K_3$), and the control module 112 is further configured to control the second switching unit $K_2$ to be in the first closed state, and form the charging branch circuit, such that the driving module 122 charges the offset capacitor Cc. When the second switching unit $K_2$ is in the first closed state, the first terminal of the offset capacitor Cc is electrically connected to the third voltage (-Vcc) via the second switching unit $K_2$, the second terminal of the offset capacitor Cc is electrically connected to the sixth voltage (GND), and the sixth voltage is higher than the third voltage.

Further, in the present embodiment, the control module 112 controls the second switching unit $K_2$ to be in the second closed state and form the offsetting branch circuit, such that the offset capacitor Cc performs charge offsetting on the detection capacitor Cx. When the second switching unit $K_2$ is in the second closed state, the first terminal of the offset capacitor Cc is electrically connected to the first terminal of the detection capacitor Cx, the second terminal of the offset capacitor Cc is electrically connected to the sixth voltage (GND), and the sixth voltage is equal to the second voltage (GND) electrically connected to the second terminal of the detection capacitor Cx.

That is, the offsetting module 132 only includes the second switching unit $K_2$, and as compared to the FIG. 2 and FIG. 4, only retains the sixth voltage (GND) in FIG. 4 and the third voltage (-Vcc) in FIG. 2.

Figure 7:
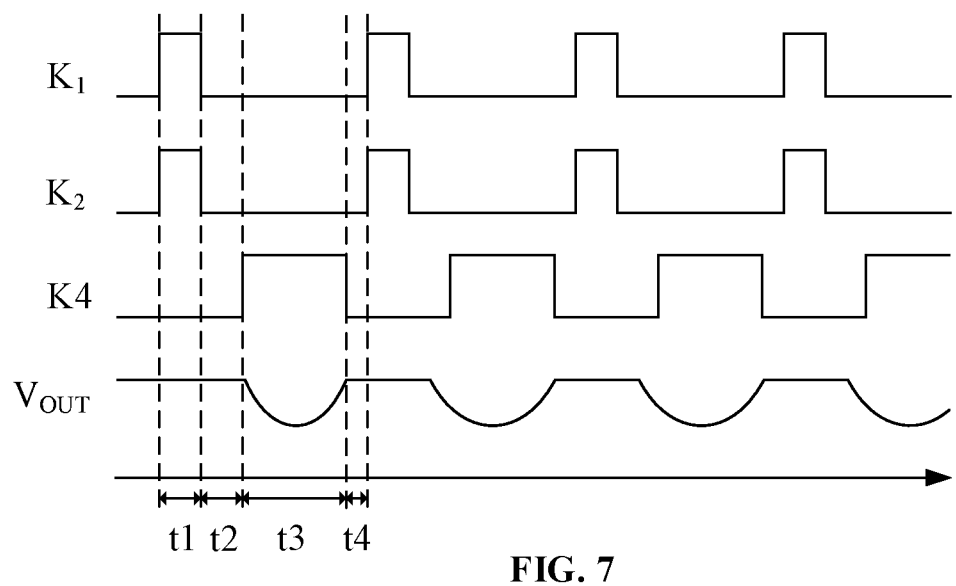
FIG. 7 is a sequence chart when the circuit for capacitance detection in FIG. 6 is working according to Embodiment VII of the present disclosure.

FIG. 7 is a sequence chart when the circuit for capacitance detection in FIG. 6 is working according to Embodiment VII of the present disclosure. As shown in FIG. 7, one detection period still includes the time intervals t1-t4. The detailed timing sequence is as follows:

In the time interval t1, the first switching unit $K_1$ is switched on, the second switching unit $K_2$ is connected to the contact S1, the fourth switching unit $K_4$ is switched off, and the detection capacitor Cx and the offset capacitor Cc are charged simultaneously. When the time interval t1 is completed, the voltage of the detection capacitor Cx is Vcc, the voltage of the offset capacitor Cc is -Vcc, and the output voltage (Vout) of the charge transfer module is 0. In this case, the amount of charge stored in the detection capacitor Cx is Q1=Vcc*Cx, and the amount of charge stored in the offset capacitor Cc is Q2=-Vcc*Cc.

In the time interval t2, the first switching unit $K_1$ and the fourth switching unit $K_4$ are switched off, the second switching unit $K_2$ is connected to the contact S2, and the charge stored in the detection capacitor Cx and the charge stored in the offset capacitor Cc are neutralized and offset. After reaching a steady state, in accordance with the charge conservation law, there is $V_{CC}C_X-V_{CC}C_C=V_X(C_X+C_C)$, and a voltage of the detection capacitor Cx may be obtained as $$V_X = \frac{V_{CC}(C_X-C_C)}{C_X+C_C}.$$

In the time interval t3, the first switching unit $K_1$ is switched off, the second switching unit $K_2$ is connected to the contact S2, and the fourth switching unit $K_4$ is switched on. Based on the magnitude of the voltage Vx, there are the situations below:

If Vx>Vcm, the detection capacitor Cx and the offset capacitor Cc transfer charge to the charge transfer module simultaneously, until the voltage of the detection capacitor Cx reaches Vcm. In this process, the output voltage (Vout) of the charge transfer module is a negative voltage.

If Vx=Vcm, then there is not a process of charge transfer from the detection capacitor Cx and the offset capacitor Cc to the charge transfer module, and the output voltage (Vout) of the charge transfer module is 0. In this case, the circuit reaches a perfect offset state. Circuit parameters (details as below) are reasonably defined, such that in case of no touching, the circuit can reach a complete offset state, and can completely offset the base capacitance of the detection capacitor Cx, while in case of touching, the capacitance of the detection capacitor Cx becomes higher on the basis of the base capacitance thereof, and the voltage of the output voltage (Vout) is completely caused by touching. Accordingly, the detection sensitivity in this state is highest.

If Vx<Vcm, the charge transfer module will charge the detection capacitor Cx and the offset capacitor Cc via the feedback network including Rf and Cf of, until both the Cx and the Cc reach Vcm. In this process, the output voltage (Vout) of the charge transfer module is a positive voltage.

During t4, the fourth switching unit $K_4$ is switched off, the charge transfer module is reset, and the output voltage (Vout) becomes 0.

Based on the time sequence of t1-t4, the amount of transferred charge may be obtained as $\Delta Q=(V_{CC}-V_{CM})(C_{X0}+\Delta C)-(V_{CC}+V_{CM})C_C$. In the complete offset state, the amount of transferred charge is $\Delta Q=(V_{CC}-V_{CM})-\Delta C$. In the complete offset state, Vx=Vcm, and there is the following relationship:

$$(V_{CC}-V_{CM})C_{X0}=(V_{CC}+V_{CM})C_C$$

The capacitance of the offset capacitor Cc may be obtained as $$C_C = \frac{V_{CC}-V_{CM}}{V_{CC}+V_{CM}} C_X,$$

and in particular, when $V_{CC}=2V_{CM}$, there is $$C_C = \frac{C_{X0}}{3}.$$

Thus, in case of complete offset, the capacitance of the offset capacitor Cc is ⅓ of the base capacitance of the detection capacitor Cx.

The capacitance of the offset capacitance Cc in the present embodiment is 7/3 times as much as that in the embodiment of FIG. 2, and is identical to that in the embodiment of FIG. 4.

In the embodiment shown in FIG. 8 below, an example is that there are two detection capacitors. Accordingly, for each of the detection capacitors, there is a driving module and an offsetting module accordingly, and further, if the driving module and the offsetting module structures of FIG. 2 are used, likewise, a first switching unit $K_1$, a second switching unit $K_2$, a third switching unit $K_3$, and a fourth switching unit $K_4$ are respectively provided, for implementing capacitance variation detection of a detection capacitor. The capacitance variation detection principle of a single detection capacitor is similar to the above FIG. 2. The description will be made below in conjunction with FIGS. 8 and 9.

Figure 8:
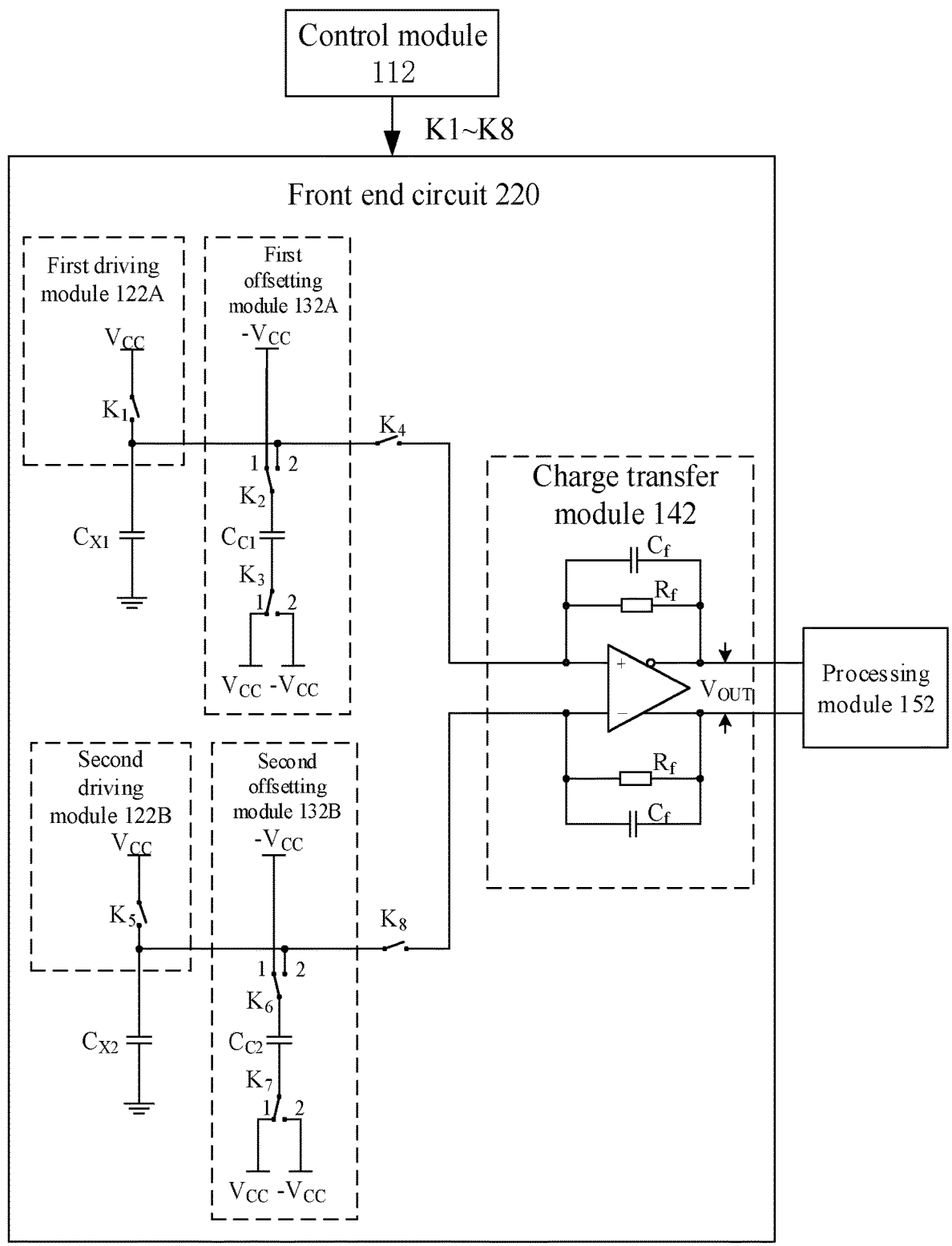
FIG. 8 is a schematic diagram of a circuit for capacitance detection according to Embodiment VIII of the present disclosure.

FIG. 8 is a schematic diagram of a circuit for capacitance detection according to Embodiment VIII of the present disclosure. The present embodiment is based on a fully differential processing architecture of adjacent detection channels, and uses a given circuit structure for each detection capacitor, thus constituting differential detection as a whole, and further contributing to suppressing interferences, such as common mode interference, temperature drift, and deformation. Specifically, as shown in FIG. 8, for the purpose of perceptual intuition, two detection capacitors are named as a first detection capacitor Cx1 and a second detection capacitor Cx2 respectively, two driving modules are named as a first driving module 122A and a second driving module 122B respectively, and two offsetting modules are named as a first offsetting module 132A and a second offsetting module 132B respectively. For implementing capacitance variation detection of the first detection capacitor Cx1, related switching unit names remain unchanged, namely, the first switching unit $K_1$, the second switching unit $K_2$, the third switching unit $K_3$, and the fourth switching unit $K_4$ respectively. For implementing capacitance variation detection of the second detection capacitor Cx2, related switching unit names are changed to a fifth switching unit $K_5$ (equivalent to $K_1$ in FIG. 2), a sixth switching unit $K_6$ (equivalent to $K_2$ in FIG. 2), a seventh switching unit $K_7$ (equivalent to $K_3$ in FIG. 2), and an eighth switching unit $K_8$ (equivalent to the $K_4$ in FIG. 2).

In addition, different from the above embodiments, the eighth switching unit $K_8$ configured to implement capacitance variation detection of the second detection capacitance Cx2 may be connected to the negative phase terminal of the charge transfer module 142.

Figure 9:
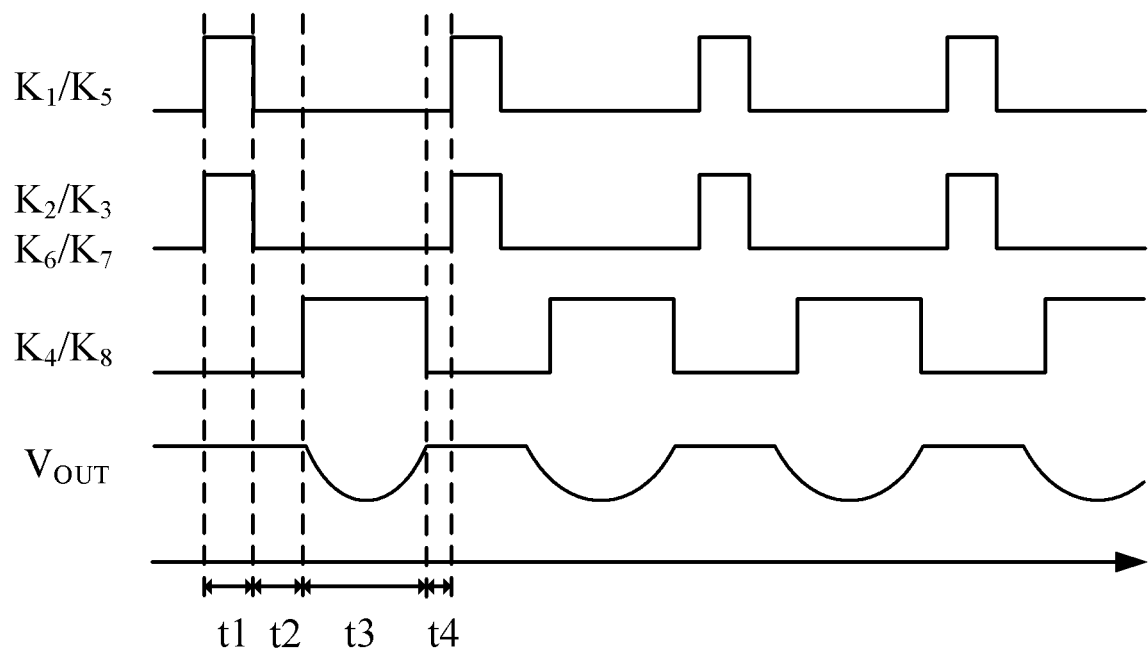
FIG. 9 is a sequence chart when the circuit for capacitance detection in FIG. 8 is working according to Embodiment VIII of the present disclosure.

FIG. 9 is a sequence chart when the circuit for capacitance detection in FIG. 8 is working according to Embodiment VIII of the present disclosure. As shown in FIG. 9, for each detection capacitor, one detection period still includes the time intervals t1-t4. The detailed timing sequence is as follows:

At a moment t1, the first switching unit $K_1$ and the fifth switching unit $K_5$ are switched on, the second switching unit $K_2$, the third switching unit $K_3$, the sixth switching unit $K_6$, and the seventh switching unit $K_7$ are connected to the contact S1, the fourth switching unit $K_4$ and the eighth switching unit $K_8$ are switched off, and the first detection capacitor Cx1, the second detection capacitor Cx2, the first offset capacitor Cc1, and the second offset capacitor Cc2 are charged simultaneously. When the moment t1 is completed, the voltage of the first detection capacitor Cx1 and the second detection capacitor Cx2 is Vcc, the voltage of the first offset capacitor Cc1 and the second offset capacitor Cc2 is −2Vcc, and the output voltage ($V_{OUT}$) of the charge transfer module is 0. In this case, the amount of charge stored in the first detection capacitor Cx1 and the second detection capacitor Cx2 is Q1=Vcc*Cx, and the amount of charge stored in the first offset capacitor Cc1 and the second offset capacitor Cc2 is Q2=−2Vcc*Cc.

At a moment t2, the first switching unit $K_1$, the fourth switching unit $K_4$, the fifth switching unit $K_5$, and the eighth switching unit $K_8$ are switched off, the second switching unit $K_2$, the third switching unit $K_3$, the sixth switching unit $K_6$, and the seventh switching unit $K_7$ are connected to the contact S2, and the charge stored in the first detection capacitor Cx1 and the second detection capacitor Cx2, and the charge stored in the first offset capacitor Cc1 and the second offset capacitor Cc2 are neutralized and offset. After reaching a steady state, the voltage of the first detection capacitor Cx1 is $$V_{X1} = \frac{V_{CC}C_{X1} - 3V_{CC}C_{C1}}{C_{X1}+C_{C1}},$$

and the voltage of the second detection capacitor Cx2 is $$V_{X2} = \frac{V_{CC}C_{X2} - 3V_{CC}C_{C2}}{C_{X2}+C_{C2}}.$$

At a moment t3, the fourth switching element $K_4$ and the eighth switching unit $K_8$ are switched on, and there is charge transfer between the first detection capacitor Cx1/the first offset capacitor Cc1 and the charge transfer module, and between the second detection capacitor Cx2/the second offset capacitor Cc2 and the charge transfer module simultaneously. When reaching a steady state, the amount of charge transferred between the first detection capacitor Cx1 and the first offset capacitor Cc1 is $\Delta Q_1=(V_{X1}-V_{CM})(C_{X1}+C_{C1})$, and the amount of charge transferred between the second detection capacitor Cx2 and the second offset capacitor Cc2 is $\Delta Q_2=(V_{X2}-V_{CM})(C_{X2}+C_{C2})$. Based on the magnitude of $\Delta Q1$ and $\Delta Q2$, there are the following situations:

if $\Delta Q1>\Delta Q2$, then there is further Vx1>Vx2, and the output voltage (Vout) of the charge transfer module is a negative voltage;

if $\Delta Q1=\Delta Q2$, then there is further Vx1=Vx2, and the output voltage (Vout) of the charge transfer module is 0; and if $\Delta Q1<\Delta Q2$, then there is further Vx1<Vx2, and the output voltage (Vout) of the charge transfer module is a positive voltage.

During t4, the fourth switching unit $K_4$ and the eighth switching unit $K_8$ are switched off, the charge transfer module 142 is reset, and the output voltage (Vout) becomes 0.

According to the above process, the amount of charge transferred between the first detection capacitor Cx1, the second detection capacitor Cx2, the first offset capacitor Cc1, the second offset capacitor Cc2, and the charge transfer module is:

$$\Delta Q=\Delta Q_1-\Delta Q_2=(V_{CC}-V_{CM})(C_{X1}-C_{X2})-(3V_{CC}+V_{CM})(C_{C1}-C_{C2})$$

Further, $C_{X1}=(C_{X10}+\Delta C_1)$, $C_{X2}=(C_{X20}+\Delta C_2)$, $\Delta C_1$ represents the capacitance variation of the detection capacitor, $C_{X10}$ represents the base capacitance of the first detection capacitor; $\Delta C_2$ represents the capacitance variation of the second detection capacitor, and $C_{X20}$ represents the base capacitance of the second detection capacitor.

In case of complete offset, the amount of transferred charge is $\Delta Q=(V_{CC}-V_{CM})(\Delta C_1-\Delta C_2)$, and an average value of the output voltage may be obtained as $V_{OUT}=2\Delta Q\cdot f\cdot R_f$.

Like the embodiment of FIG. 2, in case of complete offset in the embodiment, for the first detection capacitor and the second detection capacitor, there are respectively:

$$(V_{CC}-V_{CM})C_{X10}=(3V_{CC}+V_{CM})C_C, (V_{CC}-V_{CM})C_{X20}=(3V_{CC}+V_{CM})C_C$$

Thus, the capacitance satisfying the first offset capacitor and the capacitor satisfying the second offset capacitor meet the following relationship:

$$C_{C1}=\frac{C_{X10}}{7}, C_{C2}=\frac{C_{X20}}{7},$$

i.e., in case of complete offset, the capacitance of the first offset capacitor is 1/7 of the base capacitance of the first detection capacitor, and the capacitance of the second offset capacitor is 1/7 of the base capacitance of the second detection capacitor.

Here, it should be noted that in the embodiment of FIG. 8, the driving module and the offsetting module provided for each detection capacitor may also use the structures shown in FIG. 4 and FIG. 6. When the first detection capacitor and the second detection capacitor are provided with different driving modules and offsetting modules, the capacitance value of the first offset capacitor may be different from the capacitance value of the second offset capacitor.

An embodiment of the present disclosure further provides an electronic device, including the touch chip according to any one embodiment of the present disclosure.

In the above embodiments, considering that the offset capacitor Cc is integrated into the touch chip, the lower is the offset capacitor, the smaller are the area and cost of the touch chip. Thus, in a specific disclosure scenario, an offset capacitor with smallest capacitance is preferably selected to form the circuit for capacitance detection on the premise of reducing a detected detection capacitor.

It should be noted that, in the above embodiments, the description is made by taking switching each switching unit with a single switch as an example, but in practice, the switching unit may also be implemented in a circuit combination structure, where the constituent element may be any electronic component having an on-off function as long as the constituent element can form a charging branch circuit and an offsetting branch circuit, can implement switching from the charging branch circuit to the offsetting branch circuit, and can make the detection circuit enter a charge transfer state.

In addition, when touch control detection is implemented based on mutual capacitance detection, if base capacitance of the mutual capacitance is high enough to affect the variation rate of the mutual capacitance, the concepts of the following embodiments of the present disclosure may also be applied.

The electronic device according to the embodiments of this disclosure exists in a variety of forms, including but not limited to the following devices:

(1) Mobile communication devices: the characteristics of such devices are that they have mobile communication functions, and mainly aim to provide voice and data communication. Such terminals include: smartphones (such as iPhone), multimedia mobile phones, feature phones, low-end mobile phones, etc.

(2) Ultra-mobile PC devices: such devices belong to the category of PC, have calculating and processing functions, and usually also have mobile Internet access features. Such terminals include: PDA, MID, UMPC devices, etc., e.g. iPad.

(3) Portable entertainment devices: such devices can display and play multimedia contents. Such devices include: audio and video players (such as iPad), handheld game players, e-books, smart toys and portable vehicle navigation devices.

(4) Servers: devices providing computing service. The server components include a processor, a hard drive, an internal memory, a system bus, etc. Structures of the servers are similar to those of general computers. But because of the need of providing highly reliable service, the requirements in respect of processing capacity, stability, reliability, security, scalability, manageability, etc. are very high.

(5) Other electronic devices having data interaction functions.

So far, specific embodiments of the present subject matter have been described. Other embodiments fall within the scope of the appended claims. In some cases, actions disclosed in the appended claims may be performed in different orders and can still achieve the desired results. In addition, the processes depicted in the figures do not necessarily require the shown particular order or sequential order, to achieve desired results. In some embodiments, multitasking and parallel processing may be advantageous.

It should be further noted that the terms such as "comprising", "including" or any other variations thereof are meant to cover the non-exclusive inclusions, such that the process, method, commodity, or apparatus that includes a series of elements not only includes those elements, but also includes other elements that are not explicitly listed, or further includes elements that already existed in such process, method, commodity, or apparatus. In a circumstance without more constraints, an element defined by the phrase "comprising a . . . " does not preclude any other similar elements from existing in the process, method, commodity, or device that includes the element.

Various embodiments in the present specification are described progressively, identical or similar portions of various embodiments may be mutually referred to, and differences of each embodiment from other embodiments are mainly described in the embodiment. In particular, embodiments of the system are substantially similar to embodiments of the method, and therefore, the description is relatively simple. A part of description of the embodiments of the method may be referred to for relevant parts.

The above is merely preferred embodiments of the present disclosure, and is not intended to limit the present disclosure. For those skilled in the art, the present disclosure may have various modifications and alterations. Any modification, equivalent replacement, improvement, and the like made within the spirit and principles of the present disclosure should be included within the scope of appended claims of the present disclosure.

What is claimed is:

1. A circuit for capacitance detection, comprising: a control module, a charge transfer module, a processing module, a driving module, and an offsetting module,
    the control module being configured to: control the driving module to positively charge a detection capacitor, and control the offsetting module to negatively charge an offset capacitor in a same time interval, control the charged offset capacitor to perform charge offsetting on the charged detection capacitor to offset a base capacitance of the detection capacitor, and control the charge transfer module to convert charge of the detection capacitor after the charge offsetting to generate an output voltage; and
    the processing module being configured to determine, based on the output voltage, a capacitance variation of the detection capacitor before and after the detection capacitor is affected by an external electric field;
    wherein the offsetting module comprises a second switching unit and a third switching unit, the control module is further configured to control the second switching unit and the third switching unit to be in a first closed state and form a charging branch circuit, such that the offsetting module negatively charges the offset capacitor; and the control module is further configured to control the second switching unit and the third switching unit to be in a second closed state and form an offsetting branch circuit, such that the charged offset capacitor performs charge offsetting on the charged detection capacitor.

2. The circuit according to claim 1, wherein the driving module comprises a first switching unit, and the control module is further configured to control the first switching unit to be in a closed state, such that the driving module positively charges the detection capacitor.

3. The circuit according to claim 2, wherein the circuit further comprises a fourth switching unit, and the control module is further configured to control the fourth switching unit to be in a closed state, such that the charge transfer module is electrically connected to the detection capacitor, to convert the charge of the detection capacitor after the charge offsetting to generate the output voltage.

4. The circuit according to claim 2, wherein when the first switching unit is in the closed state, a first terminal of the detection capacitor is electrically connected to a first voltage (VCC), a second terminal of the detection capacitor is electrically connected to a second voltage (GND), and the first voltage is higher than the second voltage.

5. The circuit according to claim 4, wherein the circuit further comprises a fourth switching unit, and the control module is further configured to control the fourth switching unit to be in a closed state, such that the charge transfer module is electrically connected to the detection capacitor, to convert the charge of the detection capacitor after the charge offsetting to generate the output voltage.

6. The circuit according to claim 1, wherein when the second switching unit and the third switching unit are in the first closed state, a first terminal of the offset capacitor is electrically connected to a third voltage (−VCC) via the second switching unit, a second terminal of the offset capacitor is electrically connected to a fourth voltage (VCC) via the third switching unit, and the fourth voltage is higher than the third voltage.

7. The circuit according to claim 1, wherein when the second switching unit and the third switching unit are in the second closed state, a first terminal of the offset capacitor is electrically connected to a first terminal of the detection capacitor, a second terminal of the offset capacitor is electrically connected to a fifth voltage (−VCC), and the fifth voltage is lower than a second voltage (GND) electrically connected to the second terminal of the detection capacitor.

8. The circuit according to claim 1, wherein when the second switching unit and the third switching unit are in the second closed state, a first terminal of the offset capacitor is electrically connected to a first terminal of the detection capacitor, a second terminal of the offset capacitor is electrically connected to a sixth voltage (GND), and the sixth voltage is equal to a second voltage (GND) electrically connected to the second terminal of the detection capacitor.

9. The circuit according to claim 1, wherein the circuit further comprises a fourth switching unit, and the control module is further configured to control the fourth switching unit to be in a closed state, such that the charge transfer module is electrically connected to the detection capacitor, to convert the charge of the detection capacitor after the charge offsetting to generate the output voltage.

10. The circuit according to claim 1, wherein the offsetting module comprises a second switching unit, the control module is further configured to control the second switching unit to be in a first closed state and form a charging branch circuit, such that the offsetting module negatively charges the offset capacitor; and the control module is further configured to control the second switching unit to be in a second closed state and form an offsetting branch circuit, such that the charged offset capacitor performs charge offsetting on the charged detection capacitor.

11. The circuit according to claim 10, wherein when the second switching unit is in the first closed state, a first terminal of the offset capacitor is electrically connected to a third voltage (−VCC) via the second switching unit, a second terminal of the offset capacitor is electrically connected to a sixth voltage (GND), and the sixth voltage is higher than the third voltage.

12. The circuit according to claim 10, wherein when the second switching unit is in the second closed state, a first terminal of the offset capacitor is electrically connected to a first terminal of the detection capacitor, a second terminal of the offset capacitor is electrically connected to a sixth voltage (GND), and the sixth voltage is equal to a second voltage (GND) electrically connected to the second terminal of the detection capacitor.

13. The circuit according to claim 1, wherein the circuit further comprises a fourth switching unit, and the control module is further configured to control the fourth switching unit to be in a closed state, such that the charge transfer module is electrically connected to the detection capacitor, to convert the charge of the detection capacitor after the charge offsetting to generate the output voltage.

14. The circuit according to claim 13, wherein when there are at least two detection capacitors, then each of the detection capacitors is equipped with one driving module and one offsetting module.

15. A touch chip, comprising a circuit for capacitance detection, the circuit comprising: a control module, a charge transfer module, a processing module, a driving module, and an offsetting module, the control module being configured to: control the driving module to positively charge a detection capacitor, and control the offsetting module to negatively charge an offset capacitor in a same time interval, control the charged offset capacitor to perform charge offsetting on the charged detection capacitor to offset a base capacitance of the detection capacitor, and control the charge transfer module to convert charge of the detection capacitor after the charge offsetting on the charged detection capacitor to generate an output voltage; and the processing module being configured to determine, based on the output voltage, a capacitance variation of the detection capacitor before and after the detection capacitor is affected by an external electric field;

wherein the offsetting module comprises a second switching unit and a third switching unit, the control module is further configured to control the second switching unit and the third switching unit to be in a first closed state and form a charging branch circuit, such that the offsetting module negatively charges the offset capacitor; and the control module is further configured to control the second switching unit and the third switching unit to be in a second closed state and form an offsetting branch circuit, such that the charged offset capacitor performs charge offsetting on the charged detection capacitor.

16. The touch chip according to claim 15, wherein the driving module comprises a first switching unit, and the control module is further configured to control the first switching unit to be in a closed state, such that the driving module positively charges the detection capacitor.

17. The touch chip according to claim 16, wherein when the first switching unit is in the closed state, a first terminal of the detection capacitor is electrically connected to a first voltage (VCC), a second terminal of the detection capacitor is electrically connected to a second voltage (GND), and the first voltage is higher than the second voltage.

18. An electronic device, comprising a touch chip, the touch chip comprising a circuit for capacitance detection, the circuit comprising: a control module, a charge transfer module, a processing module, a driving module, and an offsetting module, the control module being configured to: control the driving module to positively charge a detection capacitor, and control the offsetting module to negatively charge an offset capacitor in a same time interval, control the charged offset capacitor to perform charge offsetting on the charged detection capacitor to offset a base capacitance of the detection capacitor, and control the charge transfer module to convert charge of the detection capacitor after the charge offsetting to generate an output voltage; and the processing module being configured to determine, based on the output voltage, a capacitance variation of the detection capacitor before and after the detection capacitor is affected by an external electric field;

wherein the offsetting module comprises a second switching unit and a third switching unit, the control module is further configured to control the second switching unit and the third switching unit to be in a first closed state and form a charging branch circuit, such that the offsetting module negatively charges the offset capacitor; and the control module is further configured to control the second switching unit and the third switching unit to be in a second closed state and form an offsetting branch circuit, such that the charged offset capacitor performs charge offsetting on the charged detection capacitor.

* * * * *